(12) United States Patent
Kuo et al.

(10) Patent No.: US 8,222,627 B2
(45) Date of Patent: Jul. 17, 2012

(54) PROCESS FOR MANUFACTURING A COPPER COMPATIBLE CHALCOGENIDE PHASE CHANGE MEMORY ELEMENT AND CORRESPONDING PHASE CHANGE MEMORY ELEMENT

(75) Inventors: Charles Kuo, Union City, CA (US); Yudong Kim, Cupertino, CA (US)

(73) Assignee: STMicroelectronics S.r.l, Agrate Brianza (IT)

( * ) Notice: Subject to any disclaimer, the term of this patent is extended or adjusted under 35 U.S.C. 154(b) by 921 days.

(21) Appl. No.: 12/174,462

(22) Filed: Jul. 16, 2008

(65) Prior Publication Data
US 2009/0050872 A1 Feb. 26, 2009

(30) Foreign Application Priority Data
Jul. 17, 2007 (EP) ..................... 07425437

(51) Int. Cl.
*H01L 45/00* (2006.01)
*H01L 21/00* (2006.01)
(52) U.S. Cl. .................. 257/3; 257/E31.029; 438/95
(58) Field of Classification Search .......... 257/2–5, 257/E21.159, E45.002, 295, E27.104, E29.164, 257/E21.663, E21.664, 42, E29.087; 438/3, 438/95, 102
See application file for complete search history.

(56) References Cited

U.S. PATENT DOCUMENTS

| | | | |
|---|---|---|---|
| 2002/0080647 A1 | 6/2002 | Chiang et al. | 365/175 |
| 2003/0108674 A1 | 6/2003 | Chung et al. | 427/255.394 |
| 2004/0113136 A1 | 6/2004 | Dennison | 257/2 |
| 2005/0106872 A1* | 5/2005 | Hong et al. | 438/689 |
| 2005/0269703 A1* | 12/2005 | Dunn et al. | 257/751 |
| 2006/0073631 A1* | 4/2006 | Karpov et al. | 438/102 |
| 2007/0099405 A1* | 5/2007 | Oliva et al. | 438/585 |
| 2008/0157268 A1* | 7/2008 | Kim et al. | 257/529 |
| 2009/0039331 A1* | 2/2009 | Clevenger et al. | 257/4 |

FOREIGN PATENT DOCUMENTS

| | | |
|---|---|---|
| EP | 1 677 372 | 7/2006 |
| EP | 1 764 837 A1 | 3/2007 |

OTHER PUBLICATIONS

L. Peters, "Making a Better Copper Barrier," Semiconductor International, vol. 26, No. 3, Mar. 1, 2003, pp. 50-54.

* cited by examiner

*Primary Examiner* — Victor A Mandala
*Assistant Examiner* — Selim Ahmed
(74) *Attorney, Agent, or Firm* — Seed IP Law Group PLLC

(57) ABSTRACT

A copper-diffusion plug 21 is provided within a pore in dielectric layer over a copper signal line. By positioning the plug below a chalcogenide region, the plug is effective to block copper diffusion upwardly into the pore and into the chalcogenide region and thus to avoid adversely affecting the electrical characteristics of the chalcogenide region.

34 Claims, 5 Drawing Sheets

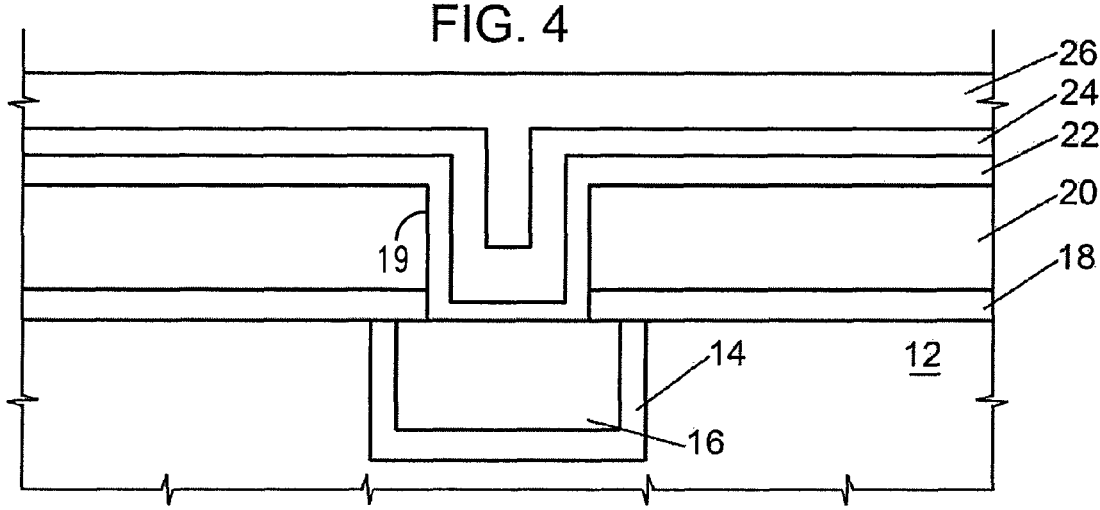
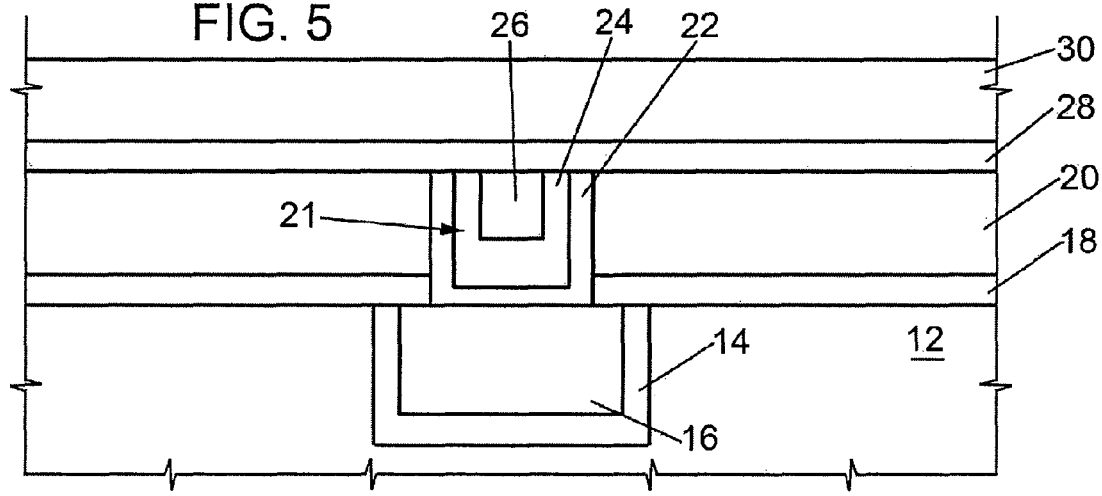
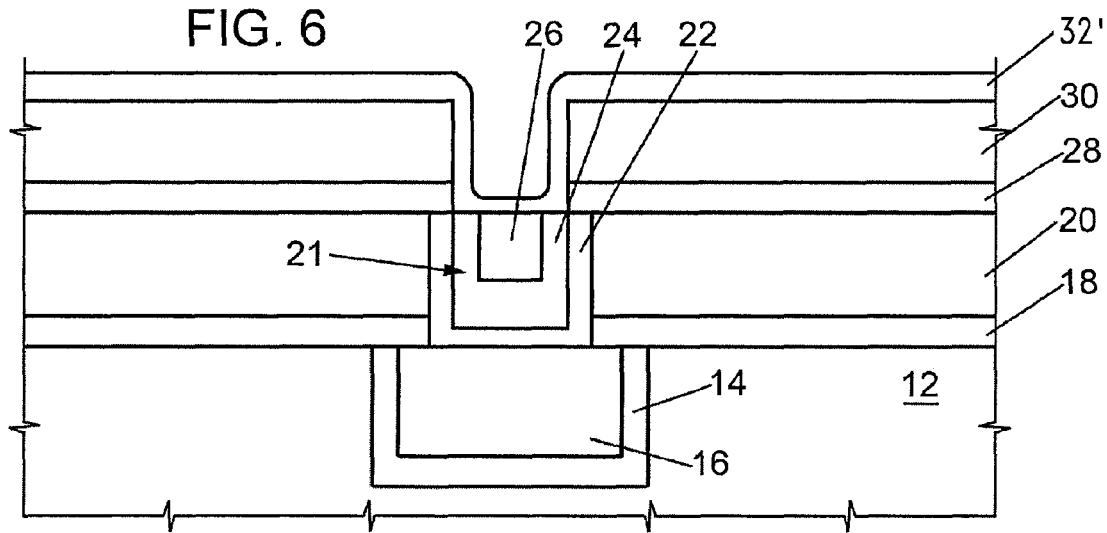

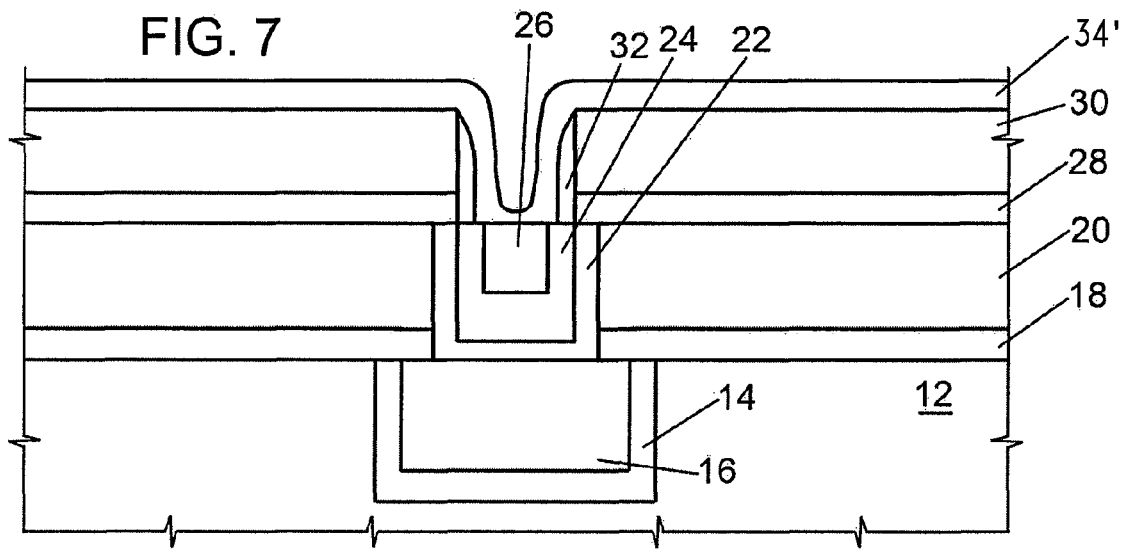
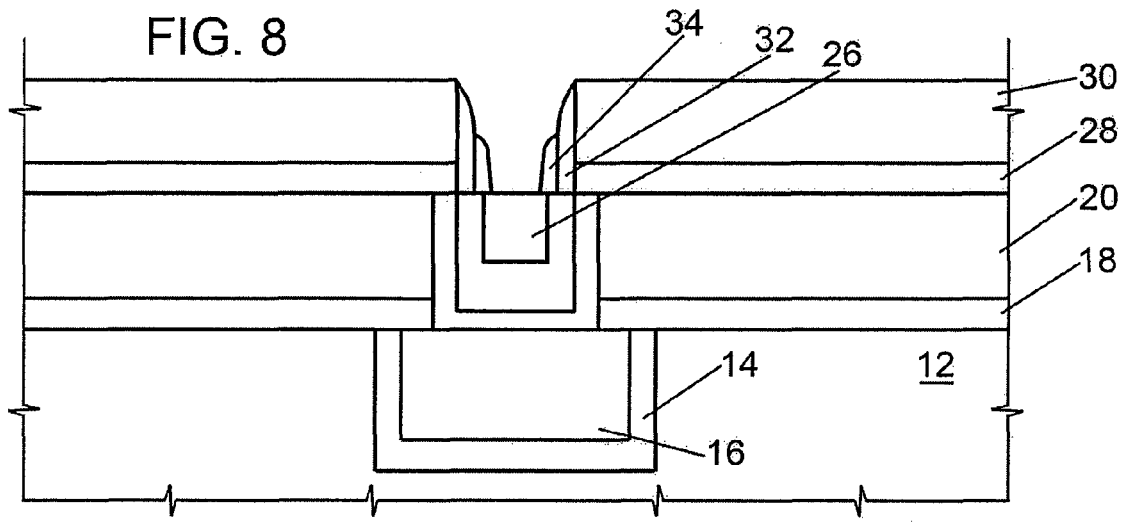
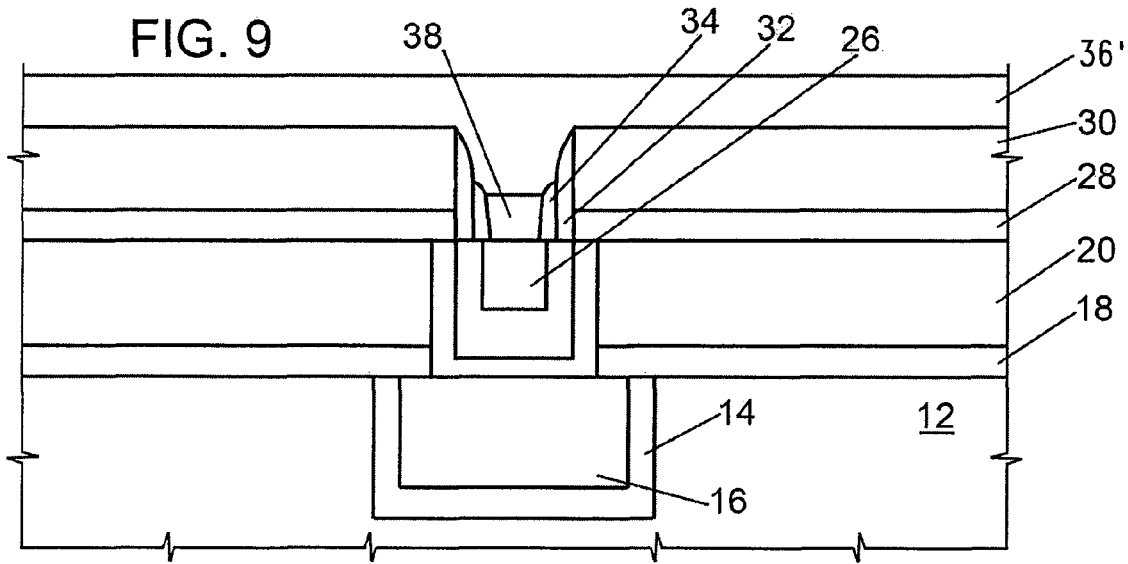

PROCESS FOR MANUFACTURING A COPPER COMPATIBLE CHALCOGENIDE PHASE CHANGE MEMORY ELEMENT AND CORRESPONDING PHASE CHANGE MEMORY ELEMENT

CROSS-REFERENCE TO RELATED APPLICATION

This application claims the benefit under 35 U.S.C. §119 (a) of European Patent Application No. 07425437.6, filed Jul. 17, 2007, which is incorporated herein by reference in its entirety.

BACKGROUND

1. Technical Field

The present invention relates generally to phase change memories that use chalcogenide materials.

2. Description of the Related Art

Phase change memory devices use phase change materials, i.e., materials that may be electrically switched between a generally amorphous and a generally crystalline state, for electronic memory application. One type of memory element utilizes a phase change material that is electrically switched between a structural state of generally amorphous and generally crystalline local order or between different detectable states of local order across the entire spectrum between completely amorphous and completely crystalline states. The state of the phase change materials is also non-volatile in that, when set in either a crystalline, semi-crystalline, amorphous, or semi-amorphous state representing a resistance value, that value is retained until changed by another programming event, as that value represents a phase or physical state of the material (e.g., crystalline or amorphous). The state is unaffected by removing electrical power.

Thus, the use of phase-change storage elements has already been proposed in memory arrays formed by a plurality of memory cells arranged in rows and columns. In order to prevent the memory cells from being affected by noise caused by adjacent memory cells, generally each memory cell comprises a phase-change storage element and a selection element (such as an MOS transistor or a diode), coupled to the phase-change storage element.

A phase-change storage element comprises a resistive element (also called a heater) and a programmable element made of a chalcogenide, also called memory element. Generally, the resistive element and the programmable element are formed by physical stacking of layers including an ovonic unified memory (OUM).

The memory cells are addressed through metal lines or connections of copper, forming row and column lines. Therefore, when the cells are made using the OUM technology, their manufacturing should be compatible with copper backend step. That is, migration of copper into the chalcogenide layers forming the programmable elements should be prevented in order not to compromise the electrical characteristics of the memory cell.

BRIEF SUMMARY

Embodiments include a phase change memory device and the manufacturing process thereof that are compatible with copper.

There are provided a method of manufacturing a copper compatible chalcogenide phase change memory and a phase change memory element, as defined respectively in claims 1 and 12.

In accordance with one embodiment, the chalcogenide that forms the memory element is isolated from the copper used for interconnects.

BRIEF DESCRIPTION OF THE SEVERAL VIEWS OF THE DRAWINGS

For the understanding of the present invention, a preferred embodiment is now described, purely as a non-limitative example, with reference to the enclosed drawings, wherein:

FIGS. 2-10 are enlarged, cross-sectional view of the present memory element at subsequent stages of manufacturing in accordance with one embodiment;

DETAILED DESCRIPTION

Figure 1:
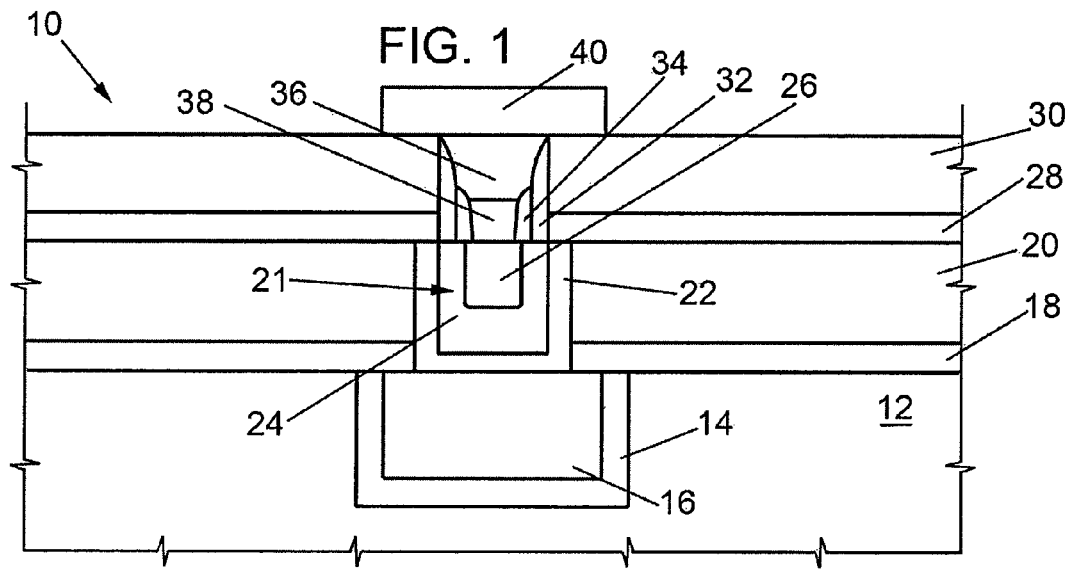
FIG. 1 is an enlarged, cross-sectional view of one embodiment of the present invention.

FIG. 1 shows a phase-change storage element 10 including a memory element of a chalcogenide material. The phase-change storage element 10 is connected to a selection device such as an ovonic threshold switch, in a per se known manner, not shown in the drawings, to form a memory cell. Furthermore, the memory cells are arranged in row and column, to form a memory array of a memory device.

In FIG. 1, a substrate 12 of a dielectric material, such as oxide, has a copper line 16 formed therein in a damascene process. The copper line 16 forms a row line and is separated from the substrate 12 by a seed layer 14, which may be any conventional copper seed layer made up of one or more elements.

A first dielectric level 18, 20 extends over the substrate 12. The dielectric level 18, 20 may comprise a nitride layer 18 covered by an oxide layer 20. However, other dielectric materials may be utilized. The dielectric layer 18, 20 has a pore extending through it, aligned with the copper line 16. A plug 21 made up of multiple layers of metal is formed in the pore.

For example, in one embodiment, the plug 21 comprises a first metal layer 22 which is U-shaped and may be formed of tantalum. A second metal layer 24 extends on top of the first metal layer 22, is also U-shaped and may be formed of tantalum nitride. A center region 26 of the plug 21 may be formed of titanium silicon nitride. The plug 21 reduces copper migration from the copper line 16 into the overlying chalcogenide.

A second dielectric level 28, 30 extends on top of the first dielectric level 18, 20. The second dielectric level 28, 30 may include one or more layers. For example, in the embodiment of FIG. 1, a nitride layer 28 is covered by an oxide layer 30. The second dielectric level 28, 30 has an opening extending through it and aligned with the pore. The opening accommodates a pair of spacers 32 and 34. However, more or fewer spacers may be used. A heater 38, e.g., of titanium silicon nitride, and a memory element 36 of chalcogenide material, e.g., of GeSbTe (GST), extend inside the spacers 32, 34, within the opening defined by the second dielectric level. The memory element 36 extends over the heater 38, here having a lance shape.

Finally, a top electrode 40 extends over the opening, is aligned and in contact with the memory element 36.

The top electrode 40 is patterned with a lithographic etch step and covered with a nitride encapsulation layer, not shown. Subsequently, an oxide layer may be deposited and polished. Then trenches are patterned; subsequently a seed layer and copper are deposited in the trenches to form column lines (not shown).

The plug 21 is effective to reduce migration of copper from the copper line 16 upwardly to the overlying memory element 36 of chalcogenide material.

The memory cell 10 of FIG. 1 may be manufactured as shown in FIGS. 2-10.

Figure 2:
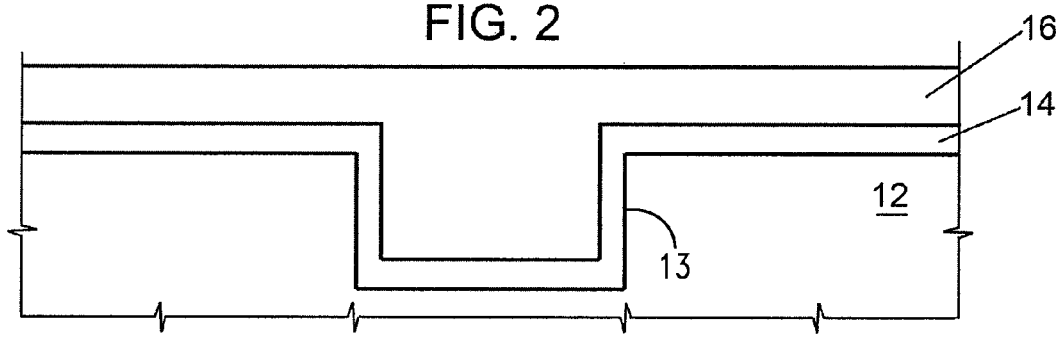

The fabrication sequence begins, as shown in FIG. 2, by forming a damascene structure in the first dielectric level 12. In detail, the first dielectric level 12 is etched to form the first pore 13, then the seed layer 14 is deposited. A copper layer 16 is then blanket deposited over the seed layer 14. Any conventional technique for the deposition or formation of the copper layer 16 may be utilized, including electroplating, electroless plating, or sputtering. Thereafter, the copper layer 16 and the seed layer 14 are planarized, FIG. 3.

Figure 3:
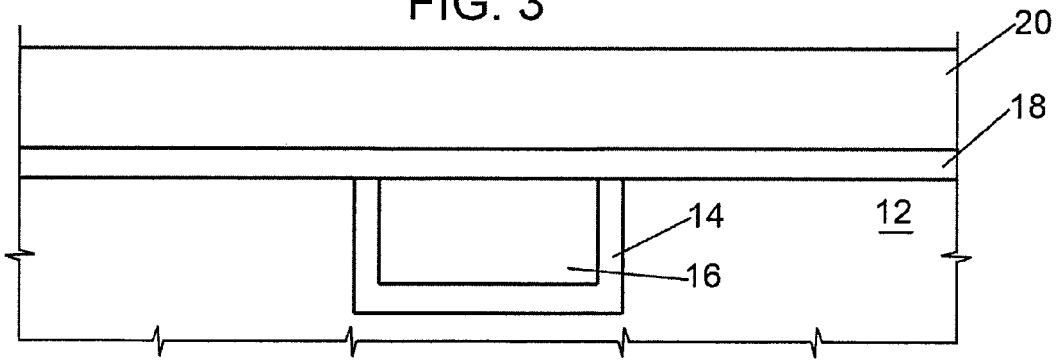

Then the first dielectric level 18, 20 is formed over the substrate 12. The first dielectric level 18, 20 includes the nitride layer 18, covered by the oxide layer 20 of greater thickness, as shown in FIG. 3.

Referring to FIG. 4, a second pore 19 is formed through the first dielectric level 18, 20 and the second pore is filled with the plug 21.

Here, the plug is made up of three different materials, including a first metal layer 22 of tantalum, a second metal layer 24 of tantalum nitride, and a third metal layer 26 of titanium silicon nitride. The tantalum nitride and tantalum are preferably not included within the upper portion that contacts the subsequently deposited chalcogenide because tantalum diffusion into the chalcogenide may reduce the heater resistance, which could compromise the cell electrical behavior.

Then, the structure is planarized to achieve the planar structure shown in FIG. 5. Extensive oxide over-polish may be used to reduce underlying copper row topology. This may be done to avoid dished areas which can trap chalcogenide material in the subsequent chalcogenide chemical mechanical planarization step.

After planarization, the nitride layer 28 and the oxide layer 30 are deposited and patterned.

Then, referring to FIG. 6, the opening is formed through the second dielectric level 28, 30 and a dual spacer layer 32', 34' is formed. The use of a dual spacer layer 32', 34' reduces the diameter of the heater 38 and minimizes the heater seam. In detail, a first spacer layer 32' is deposited to cover the walls of the opening and is anisotropically etched to remove it from the bottom of the opening and over the second dielectric layer 28, 30. Thereby the spacer 32 shown in FIG. 7 is formed from the first spacer layer 32'. Then, the second spacer layer 34' is deposited and, likewise, anisotropically etched to remove it from the bottom of the opening and over the second dielectric layer 28, 30. Thereby the dual spacers structure 32, 34 shown in FIG. 8 is obtained.

A heater layer 38, e.g., of titanium silicon nitride, is subsequently deposited into the resulting pore, as shown in FIG. 9. Then, the heater layer 38 is etched back to reduce its vertical height. The heater layer 38 may be etched using a dip back or wet or dry etch back. This etching back of the heater 38 leaves a recess wherein a chalcogenide layer 36' is deposited, as shown in FIG. 9.

Figure 10:
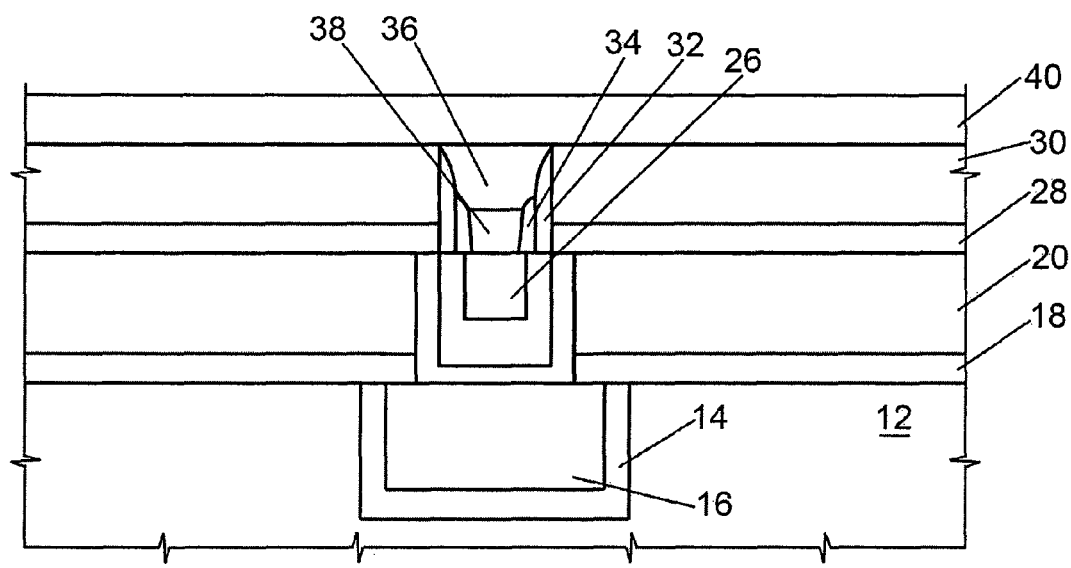

Then the chalcogenide layer 36' is polished back in a chemical-mechanical planarization step, thus forming the memory element 36 of FIG. 10. Thereafter, the top electrode 40 is deposited, patterned, and etched to create the structure shown in FIG. 1.

Figure 11:
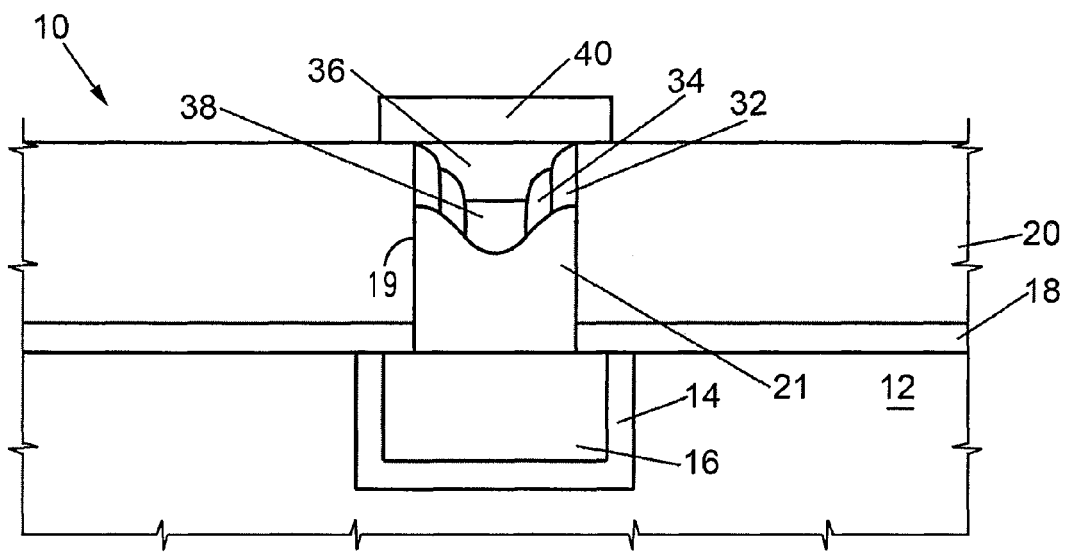
FIG. 11 is an enlarged, cross-sectional view of another embodiment of the present invention.

In accordance with another embodiment of the present invention, shown in FIG. 11, the plug 21 is only formed by a metal region, e.g., of TiSiN. To this end, after planarizing the plug 21, the latter is be dipped back partially, creating an opening at the upper end of that pore. Then, the spacers 32 and 34 are formed, as described above, and the heater 38 and the memory element 36 are formed thereover, still within the same pore 19 as the plug 21. As a result, a lance structure that includes the heater 38 and the memory element 36 is self-aligned to the plug 21.

In other embodiments, the heater 38 may be totally omitted or the plug 21 may be formed by a multilayer of different metal layers, analogously to FIG. 1.

Programming of the memory element 36 to alter the state or phase of the material may be accomplished by applying voltage potentials to the copper line 16, formed on substrate 12, and top electrode 40, thereby generating a voltage potential across the phase-change storage element 10. When the voltage potential is greater than the threshold voltage of the memory element 36, then an electrical current may flow through the memory element 36, and results in heating of the memory element 36 by the heater 38.

This heating may alter the memory state or phase of the memory element 36. Altering the phase or state of the memory element 36 alters the electrical characteristic of the chalcogenide material, e.g., the resistance of the material.

In the "reset" state, memory material is in an amorphous or semi-amorphous state and in the "set" state, memory material is in a crystalline or semi-crystalline state. Both "reset" and "set" states can exist without any energy (electrical, optical, mechanical) applied to bistable chalcogenide. The resistance of memory material in the amorphous or semi-amorphous state is greater than the resistance of memory material in the crystalline or semi-crystalline state. It is to be appreciated that the association of reset and set with amorphous and crystalline states, respectively, is a convention and that at least an opposite convention may be adopted.

Using electrical current, memory material may be heated to a relatively higher temperature to amorphosize memory material and "reset" memory material (e.g., program memory material to a logic "0" value). Heating the volume of memory material to a relatively lower crystallization temperature crystallizes memory material and "set" memory material (e.g., program memory material to a logic "1" value). Various resistances of memory material may be achieved to store information by varying the amount of current flow and duration through the volume of memory material.

Figure 12:
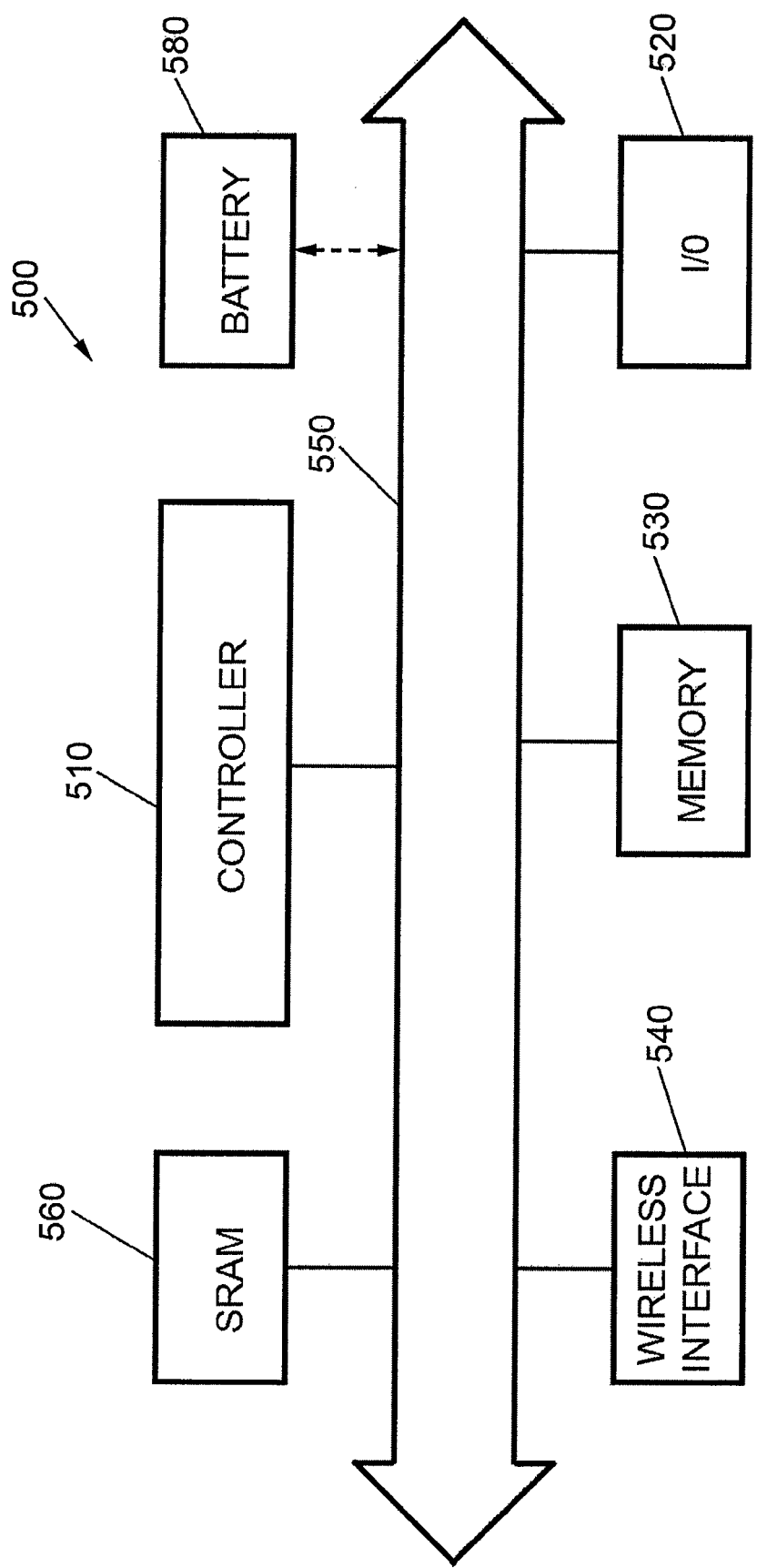
FIG. 12 is a system depiction in accordance with one embodiment of the present invention.

Turning to FIG. 12, a portion of a system 500 in accordance with an embodiment is described. System 500 may be used in wireless or mobile devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, a cellular network, although the scope of the present invention is not limited in this respect.

System 500 includes a controller 510, an input/output (I/O) device 520 (e.g., a keypad, display), static random access memory (SRAM) 560, a memory 530, and a wireless interface 540 coupled to each other via a bus 550. A battery 580 is used in some embodiments.

Controller 510 may comprise, for example, one or more microprocessors, digital signal processors, microcontrollers, or the like. Memory 530 may be used to store messages transmitted to or by system 500. Memory 530 may also optionally be used to store instructions that are executed by controller 510 during the operation of system 500, and may be used to store user data. Memory 530 may be provided by one or more different types of memory. For example, memory 530 may comprise any type of random access memory, a volatile memory, a non-volatile memory such as a flash memory, besides of memory device having the phase change storage element 10 discussed herein.

I/O device 520 may be used by a user to generate a message. System 500 may use wireless interface 540 to transmit and receive messages to and from a wireless communication network with a radio frequency (RF) signal. Examples of wireless interface 540 include an antenna or a wireless transceiver, although the scope of the present invention is not limited in this respect.

The process as described herein is completely compatible with conventional copper interconnect lines, thereby allowing stackable phase change memory array layers. Also, the problems associated with dot patterning of the chalcogenide material may be reduced.

Finally, it is clear that numerous variations and modifications may be made to the phase change memory element and process described and illustrated herein, all falling within the scope of the invention. For example, the process may dispense of the steps for forming the heater, creating a heaterless cell.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   manufacturing a phase change memory element, the manufacturing including:
   forming a substrate;
   forming a copper signal line in the substrate;
   forming a copper-diffusion barrier over the copper signal line;
   forming a chalcogenide region over said copper-diffusion barrier; and
   forming a heater over the copper-diffusion barrier, the heater separating the copper-diffusion barrier from the chalcogenide region.

2. The method of claim 1, further comprising:
   forming a pore over the copper signal line;
   forming the copper-diffusion barrier in the pore, the forming of the copper-diffusion barrier including:
   forming a copper barrier plug in the pore by forming multiple layers in the pore.

3. The method of claim 2, wherein forming the multiple layers includes forming a first tantalum-based metal layer and forming a second metal layer that does not contain tantalum, the second metal layer spacing the first tantalum-based metal layer from said chalcogenide region.

4. The method of claim 3, wherein forming the first tantalum-based metal layer includes forming a tantalum layer and forming a tantalum nitride layer over said tantalum layer.

5. The method of claim 3, wherein forming the second metal layer includes forming a titanium silicon nitride layer over said first tantalum-based metal layer.

6. The method of claim 1, further comprising:
   forming a pore over the copper signal line, the forming the pore including:
   forming a first dielectric layer over the substrate; and
   etching the first dielectric layer;
   forming the copper-diffusion barrier in the pore, the forming of the copper-diffusion barrier including:
   forming a copper barrier plug by depositing a plug layer in the pore and planarizing said plug layer.

7. The method of claim 6, wherein forming the chalcogenide region includes depositing a second dielectric layer over said first dielectric layer, forming an opening in said second dielectric layer, said opening being part of said pore, and forming the chalcogenide region in the opening.

8. The method of claim 7, including forming a spacer structure over said plug in said opening before forming the chalcogenide region.

9. The method of claim 1, further comprising:
   forming a pore over the copper signal line, the forming of the pore including:
   forming a first dielectric layer over the substrate; and
   etching said first dielectric layer to form the pore;
   forming the copper-diffusion barrier in the pore includes
   forming a copper barrier plug by depositing a plug layer and partially dipping back the plug layer.

10. The method of claim 1, including:
    forming a pore over the copper signal line;
    forming the copper-diffusion barrier in the pore by forming a copper barrier plug; and
    forming a spacer structure over said copper barrier plug in said pore.

11. The method of claim 10 wherein forming the spacer structure comprises forming a pair of overlapping sidewall spacers.

12. A phase change memory element comprising:
    a substrate;
    a copper signal line in the substrate;
    a copper-diffusion barrier over said copper signal line;
    a chalcogenide region over said copper-diffusion barrier; and
    a heater positioned over the copper-diffusion barrier and completely under the chalcogenide region.

13. The memory element of claim 12, wherein said copper-diffusion barrier includes a tantalum-based region.

14. The memory element of claim 13, wherein said tantalum-based region includes a tantalum layer and a nitride layer over the tantalum layer.

15. The memory element of claim 13, wherein said copper-diffusion barrier further comprises a tantalum-diffusion barrier that spaces said tantalum-based layer from said chalcogenide region.

16. The memory element of claim 15, wherein said tantalum-diffusion barrier includes titanium silicon nitride.

17. The memory element of claim 12, comprising:
    a first dielectric layer over said substrate;
    a pore in said first dielectric layer over said copper-diffusion barrier; and
    a sidewall spacer structure positioned within the pore, the chalcogenide region being positioned inside the sidewall spacer structure.

18. The memory element of claim 17, wherein the sidewall spacer structure includes a pair of overlapping sidewall spacers.

19. The memory element of claim 17, further comprising a second dielectric layer over said first dielectric layer, the second dielectric layer having an opening which is part of said pore, the sidewall spacer structure and the chalcogenide region extending in the opening in the second dielectric layer.

20. A system comprising:
    a processor;
    a static random access memory coupled to said processor; and
    a memory coupled to said processor, the memory having a phase change memory element that includes:
    a substrate;
    a copper signal line in the substrate;
    a copper-diffusion barrier over said copper signal line;
    a chalcogenide region over said copper-diffusion barrier; and
    a heater positioned over the copper-diffusion barrier and completely under the chalcogenide region.

21. The system of claim 20, wherein said copper-diffusion barrier includes a tantalum-based region.

22. The system of claim 21, wherein said tantalum-based region includes a tantalum layer and a nitride layer over the tantalum layer.

23. The system of claim 21, wherein said copper-diffusion barrier further comprises a tantalum-diffusion barrier that spaces said tantalum-based layer from said chalcogenide region.

24. The system of claim 23, wherein said tantalum-diffusion barrier includes titanium silicon nitride.

25. The system of claim 20, wherein the memory element includes:
a first dielectric layer over said substrate,
a pore in said first dielectric layer over said copper-diffusion barrier, and
a sidewall spacer structure positioned within the pore, the chalcogenide region being positioned inside the sidewall spacer structure.

26. The system of claim 25, wherein the memory element includes a second dielectric layer over said first dielectric layer, the second dielectric layer having an opening which is part of said pore, the sidewall spacer structure and the chalcogenide region extending in the opening in the second dielectric layer.

27. The system of claim 20, wherein the memory element includes a dielectric region on the substrate, the dielectric region including a pore over the copper signal line, wherein the copper-diffusion barrier, chalcogenide region, and heater are positioned in the pore.

28. The system of claim 27, wherein the dielectric region includes:
a first dielectric layer having a first opening in which the copper-diffusion barrier is positioned; and
a second dielectric layer having a second opening in which the heater and chalcogenide region are positioned, the pore including the first and second openings.

29. The system of claim 27, wherein the dielectric region includes a dielectric layer an opening in which the copper-diffusion barrier, chalcogenide region, and heater are positioned, the pore including the opening.

30. The system of claim 29, wherein:
the copper-diffusion barrier extends entirely across a lower portion of the opening;
the memory element includes spacers positioned on opposite sides of an upper portion of the spacer;
the heater is positioned on the copper-diffusion barrier and between the spacers; and
the chalcogenide region is positioned on the heater and between the spacers.

31. The memory element of claim 12, further comprising a dielectric region on the substrate, the dielectric region including a pore over the copper signal line, wherein the copper-diffusion barrier, chalcogenide region, and heater are positioned in the pore.

32. The memory element of claim 31, wherein the dielectric region includes:
a first dielectric layer having a first opening in which the copper-diffusion barrier is positioned; and
a second dielectric layer having a second opening in which the heater and chalcogenide region are positioned, the pore including the first and second openings.

33. The memory element of claim 31, wherein the dielectric region includes a dielectric layer an opening in which the copper-diffusion barrier, chalcogenide region, and heater are positioned, the pore including the opening.

34. The memory element of claim 33, comprising spacers positioned on opposite sides of an upper portion of the opening, wherein the copper-diffusion barrier extends entirely across a lower portion of the opening, the heater is positioned on the copper-diffusion barrier and between the spacers; and the chalcogenide region is positioned on the heater and between the spacers.

* * * * *